US009535102B2

(12) United States Patent
Takahashi et al.

(10) Patent No.: US 9,535,102 B2
(45) Date of Patent: Jan. 3, 2017

(54) TEST SIGNAL SUPPLYING DEVICE AND SEMICONDUCTOR INTEGRATED CIRCUIT

(71) Applicant: Yamaha Corporation, Hamamatsu-shi, Shizuoka (JP)

(72) Inventors: Kunito Takahashi, Hamamatsu (JP); Akihiko Toda, Hamamatsu (JP); Tatsuya Kishii, Iwata (JP)

(73) Assignee: Yamaha Corporation, Hamamatsu-shi (JP)

( * ) Notice: Subject to any disclaimer, the term of this patent is extended or adjusted under 35 U.S.C. 154(b) by 898 days.

(21) Appl. No.: 13/895,837

(22) Filed: May 16, 2013

(65) Prior Publication Data

US 2013/0307561 A1    Nov. 21, 2013

(30) Foreign Application Priority Data

May 17, 2012  (JP) .................................. 2012-113383
May 17, 2012  (JP) .................................. 2012-113384

(51) Int. Cl.
*G01R 27/28* (2006.01)
*G01R 27/02* (2006.01)
(Continued)

(52) U.S. Cl.
CPC .............. *G01R 27/02* (2013.01); *H04R 29/001* (2013.01); *G01R 31/2825* (2013.01)

(58) Field of Classification Search
CPC ..................... G01R 31/3662; G01R 31/31704; G01R 31/31932; H04L 12/10; H01L 2924/00014
(Continued)

(56) References Cited

U.S. PATENT DOCUMENTS

2004/0081099 A1    4/2004   Patterson et al.
2004/0259435 A1   12/2004   Stephan et al.
(Continued)

FOREIGN PATENT DOCUMENTS

CN    1300945 A    6/2001
CN    1655649 A    8/2005
(Continued)

OTHER PUBLICATIONS

Japanese Office Action issued in counterpart Japanese Application No. 2012-113384 dated Aug. 18, 2015 with English-language translation (fifteen (15) pages).
(Continued)

*Primary Examiner* — Melissa Koval
*Assistant Examiner* — Trung Nguyen
(74) *Attorney, Agent, or Firm* — Crowell & Moring LLP

(57) ABSTRACT

A test signal supplying device includes a first external terminal, a second external terminal being applied with a predetermined electric potential, an internal load, a first terminal that is connected to the first external terminal through the internal load, a second terminal that is connected to the first external terminal without passing through the internal load, a test signal generating section that generates a test signal and supplies the test signal to the second terminal, a detecting section that detects an amplitude of the test signal, and a controlling section that measures an impedance of an external load connected to the first and second external terminals based on the detected amplitude of the test signal.

20 Claims, 12 Drawing Sheets

(51) Int. Cl.
*H04R 29/00* (2006.01)
*G01R 31/28* (2006.01)

(58) Field of Classification Search
USPC .............. 324/638, 601, 615, 637, 600, 500, 76.12,324/76.13, 76.11, 603–614, 629, 542, 522–533,324/667, 674, 676, 708–713
See application file for complete search history.

(56) References Cited

U.S. PATENT DOCUMENTS

| | | | |
|---|---|---|---|
| 2004/0260846 | A1 | 12/2004 | Stephan et al. |
| 2005/0175195 | A1 | 8/2005 | Cheney, Jr. et al. |
| 2007/0080744 | A1* | 4/2007 | Arndt ................. H03K 17/0822 327/546 |
| 2007/0098190 | A1 | 5/2007 | Song et al. |
| 2009/0051368 | A1 | 2/2009 | Knott |
| 2009/0196435 | A1 | 8/2009 | Miao |
| 2012/0315043 | A1* | 12/2012 | Nakagawa ......... H04B 10/5053 398/65 |

FOREIGN PATENT DOCUMENTS

| | | |
|---|---|---|
| CN | 1967269 A | 5/2007 |
| CN | 202150939 U | 2/2012 |
| EP | 1 995 872 A1 | 11/2008 |
| EP | 2 006 692 A2 | 12/2008 |
| JP | 10-327026 A | 12/1998 |
| JP | 11-355880 A | 12/1999 |
| JP | 2003-179441 A | 6/2003 |
| JP | 2005-531227 A | 10/2005 |
| JP | 2006-13774 A | 1/2006 |
| JP | 4182802 B2 | 11/2008 |
| JP | 2009-296478 A | 12/2009 |
| JP | 2011-511576 A | 4/2011 |
| JP | 2013-131910 A | 7/2013 |

OTHER PUBLICATIONS

Chinese Office Action dated Apr. 24, 2015 with English-language translation (twenty-four (24) pages).

* cited by examiner

TEST SIGNAL SUPPLYING DEVICE AND SEMICONDUCTOR INTEGRATED CIRCUIT

BACKGROUND

1. Technical Field

The present invention relates to a technique for measuring an impedance by supplying a test signal to an external load. Also, the present invention relates to a technique for adjusting an amplitude of an output signal in accordance with the external load.

2. Background Art

In a sound output circuit that amplifies a sound signal and outputs the amplified signal to an external load, one which measures an impedance of the external load and switches between sound signals in accordance with a measured value of the external load, is known (JP-A-2003-179441). A speaker or a headphone to be connected as the external load, can have an impedance of 4, 8, 16 or 32Ω. In a conventional technique, since a sound signal is switched in accordance with the external load connected to the sound output circuit, the technique has an advantage that it is possible to prevent a device connected to the sound output circuit as the external load from being damaged by an excessive input, in advance.

Meanwhile, it is thought that a test signal is supplied to an external load in order to measure an impedance of the external load. In this case, an output signal and the test signal are switched to be supplied to the external load.

However, from a view point of protection of the external load, it is general that the output signal is supplied to the external load through an internal load such as a protection resistor or the like in a signal amplifying device. In this case, when the test signal is supplied to the external load through the internal load, a problem arises that a total impedance of the internal load and the external load is to be measured so that the impedance of the external load is not accurately measured.

Also, in a signal amplifying circuit that amplifies an input signal and outputs the amplified signal to an external load, a technique is known in which a test signal is supplied to an external load and determination is made as to whether the external load is a stereo plug or a monaural plug (JP-B-4182802). In the technique, a frequency of the test signal is set to a high frequency out of an audible band so that a user does not hear a sound of the test signal.

A speaker or a headphone to be connected as an external load has a reactance component so that an impedance thereof varies due to a change in a frequency. Therefore, when a test signal is set to a high frequency out of an audible band, the impedance in the high frequency may be possibly deviated from an impedance in the audible band. Consequently, the impedance in a required audible band is not able to be accurately obtained. In addition, the test signal may be attenuated in the external load so that it may become difficult to measure the impedance at a high SN ratio. Moreover, it is necessary to expand a frequency characteristic of a circuit for generating the test signal up to a high frequency out of an audible band so that it is necessary to cause components constituting a signal amplifying circuit such as transistors to correspond to the high frequency.

SUMMARY

A purpose of the invention is to adjust an amplitude of an output signal in accordance with an impedance of an external load. Also, a purpose of the invention is to make it possible to measure the impedance of the external load without allowing a user to be aware of that even when a frequency of a test signal is not set to a high frequency out of an audible band.

In order to achieve the above object, according to the present invention, there is provided a test signal supplying device, comprising:

a first external terminal;

a second external terminal being applied with a predetermined electric potential;

an internal load;

a first terminal that is connected to the first external terminal through the internal load;

a second terminal that is connected to the first external terminal without passing through the internal load;

a test signal generating section that generates a test signal and supplies the test signal to the second terminal;

a detecting section that detects an amplitude of the test signal; and a controlling section that measures an impedance of an external load connected to the first and second external terminals based on the detected amplitude of the test signal.

For example, the test signal supplying device further comprises:

an amplifying section that amplifies an input signal and outputs an output signal to the first terminal, wherein the controlling section controls a gain of the amplifying section based on the measured impedance of the external load.

For example, the test signal supplying device further comprises:

a resistor having one end being connected to the test signal generating section and the other end being connected to the second terminal, wherein the detecting section detects the amplitude of the test signal at least one of the one end and the other end of the resistor.

For example, the controlling section controls the amplifying section so that an output impedance of the amplifying section is in a high impedance state during a testing time period where the test signal generating section outputs the test signal, and the controlling section controls the test signal generating section so that an output impedance of the test signal generating section in a high impedance state and controls the amplifying section so as to output the output signal to the first terminal during a time period other than the testing time period.

For example, the predetermined electric potential is a ground electric potential.

For example, the test signal has a waveform containing one wavelength of a cosine wave.

For example, the waveform of the test signal is formed of a part from an upper side peak to a subsequent upper side peak in the cosine wave.

For example, the input signal is a sound signal, and the test signal has a frequency being lower than the highest frequency of an audible band.

According to the present invention, there is also provided a semiconductor integrated circuit, comprising:

a first terminal to be connected to a first external terminal through an internal load;

a second terminal to be connected to the first external terminal without passing through the internal load;

a test signal generating section that generates a test signal and supplies the test signal to the second terminal;

a detecting section that detects an amplitude of the test signal; and a controlling section that measures an impedance of an external load connected to the first and second external terminals based on the detected amplitude of the test signal.

For example, the semiconductor integrated circuit further comprises: an amplifying section that amplifies an input signal and outputs an output signal to the first terminal, wherein the controlling section controls a gain of the amplifying section based on the measured impedance of the external load.

For example, the semiconductor integrated circuit further comprises: a resistor having one end being connected to the test signal generating section and the other end being connected to the second terminal, wherein the detecting section detects the amplitude of the test signal at least one of the one end and the other end of the resistor.

For example, the controlling section controls the amplifying section so that an output impedance of the amplifying section is in a high impedance state during a testing time period where the test signal generating section outputs the test signal, and the controlling section controls the test signal generating section so that an output impedance of the test signal generating section in a high impedance state and controls the amplifying section so as to output the output signal to the first terminal during a time period other than the testing time period.

According to the present invention, there is also provided a test signal supplying device, comprising:

an external terminal;

an internal load connected to the external terminal;

a test signal generating section that generates a test signal having a waveform containing one wavelength of a cosine wave and supplies the test signal to the external terminal;

a detecting section that detects an amplitude of the test signal; and a controlling section that measures an impedance of an external load connected to the external terminal based on the detected amplitude of the test signal.

For example, the waveform of the test signal is formed of a part from an upper side peak to a subsequent upper side peak in the cosine wave.

For example, the test signal supplying device further comprises: an amplifying section that amplifies an input signal and outputs an output signal to the internal load, wherein the controlling section controls a gain of the amplifying section based on the measured impedance of the external load.

For example, the input signal is a sound signal, and the test signal has a frequency being lower than the highest frequency of an audible band.

For example, the test signal supplying device further comprises:

a resistor having one end being connected to the test signal generating section and the other end being connected to the external terminal, wherein the detecting section detects the amplitude of the test signal at least one of the one end and the other end of the resistor.

For example, the controlling section controls the amplifying section so that an output impedance of the amplifying section is in a high impedance state during a testing time period where the test signal generating section outputs the test signal, and the controlling section controls the test signal generating section so that an output impedance of the test signal generating section in a high impedance state and controls the amplifying section so as to output the output signal to the first terminal during a time period other than the testing time period.

According to the present invention, there is also provided a semiconductor integrated circuit, comprising:

a first terminal to be connected to an external terminal through an internal load or without through the internal load;

a test signal generating section that generates a test signal having a waveform containing one wavelength of a cosine wave and supplies the test signal to the first terminal;

a detecting section that detects an amplitude of the test signal; and a controlling section that measures an impedance of an external load connected to the external terminal based on the detected amplitude of the test signal.

For example, the waveform of the test signal is formed of a part from an upper side peak to a subsequent upper side peak in the cosine wave.

For example, the semiconductor integrated circuit further comprises:

an amplifying section that amplifies an input signal and outputs an output signal to the first terminal or a second terminal different from the first terminal, wherein the controlling section controls a gain of the amplifying section based on the measured impedance of the external load.

For example, the input signal is a sound signal, and the test signal has a frequency being lower than the highest frequency of an audible band.

For example, the semiconductor integrated circuit further comprises:

a resistor having one end being connected to the test signal generating section and the other end being connected to the first terminal, wherein the detecting section detects the amplitude of the test signal at least one of the one end and the other end of the resistor.

For example, the controlling section controls the amplifying section so that an output impedance of the amplifying section is in a high impedance state during a testing time period where the test signal generating section outputs the test signal, and the controlling section controls the test signal generating section so that an output impedance of the test signal generating section in a high impedance state and controls the amplifying section so as to output the output signal to the first terminal during a time period other than the testing time period.

BRIEF DESCRIPTION OF THE DRAWINGS

The above objects and advantages of the present invention will become more apparent by describing in detail preferred exemplary embodiments thereof with reference to the accompanying drawings, wherein.

DETAILED DESCRIPTION OF EXEMPLARY EMBODIMENTS

1. Embodiment

Figure 1:
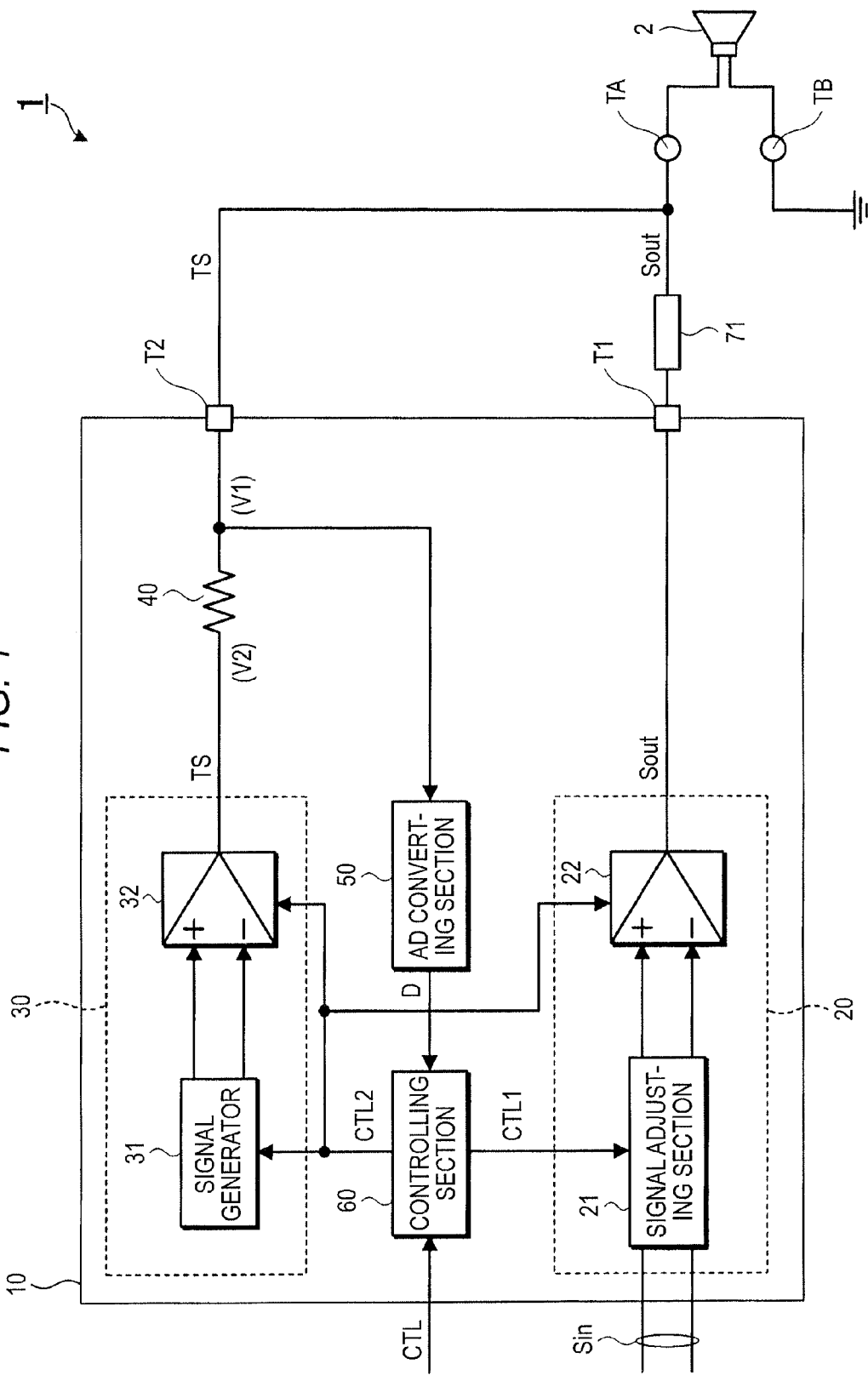
FIG. 1 is a block diagram showing a structure of a signal amplifying device according to an embodiment of the invention.

An embodiment of the invention will be described below with reference to the accompanying drawings. FIG. 1 is a block diagram showing a principal structure of a signal amplifying device 1 according to the embodiment of the invention. The signal amplifying device 1 includes a semiconductor integrated circuit 10 constituted by an IC, an IC module or the like, a first external terminal TA, a second external terminal TB and an internal load 71.

The first external terminal TA and the second external terminal TB correspond to, for example, contact points between a jack of a headphone and a plug. The external load 2 is connected to the first external terminal TA and the second external terminal TB. A headphone, a speaker and the like having different impedances can be used for the external load 2. In the above embodiment, a test signal TS or an output signal Sout is output from the first external terminal TA, and a ground electric potential (a predetermined electric potential) is supplied to the second external terminal TB. The semiconductor integrated circuit 10 is adapted to supply the test signal TS to the external load 2 during a testing time period, and to adjust an amplitude of the output signal Sout in accordance with an impedance of the external load 2 during a time period other than the testing time period.

The internal load 71 is interposed between the first external terminal TA and the semiconductor integrated circuit 10. The internal load 71 can be formed to have a ferrite bead for removing noise of a high frequency or a protection resistor for protecting the external load 2 such as a speaker, a headphone or the like from a signal having a large amplitude.

The semiconductor integrated circuit 10 includes a first terminal T1 to be connected to the internal load 71 and a second terminal T2 to be connected to the first external terminal TA.

In addition, the semiconductor integrated circuit 10 includes an amplifying section 20 that amplifies an input signal Sin in a differential type and generates an output signal Sout in a single end type so as to supply it to the first terminal T1. To be more specific, the amplifying section 20 has a signal adjusting section 21 that adjusts an amplitude of the input signal Sin on the basis of a first control signal CTL1 and an amplifier 22. In the embodiment, a gain of the amplifier 22 is fixed, and a gain of the amplifying section 20 is controlled by the signal adjusting section 21. Incidentally, while the input signal Sin is in the differential type in the embodiment, it can be in the single end type, as a matter of course. In the above case, the signal adjusting section 21 and the amplifier 22 are formed in the single end styles.

Figure 2:
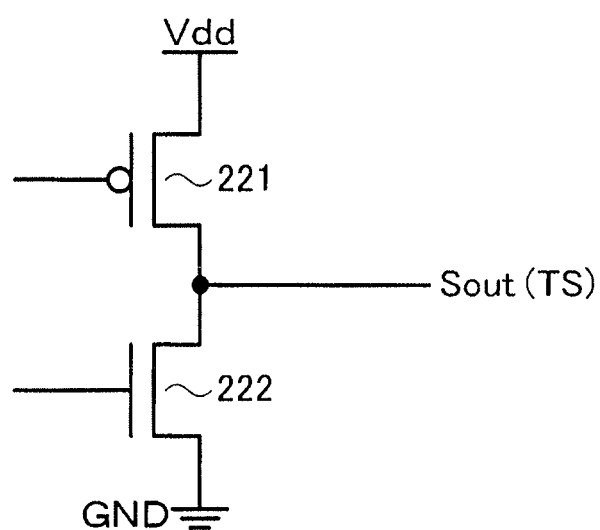
FIG. 2 is a circuit diagram showing a structure of an output stage of an amplifier.

In addition, a second control signal CTL2 which is in a high level during a testing time period and is in a low level during a time period other than the testing time period, is supplied to the amplifier 22. An output stage of the amplifier 22 is configured such that, for example, a P-channel transistor 221 and an N-channel transistor 222 are connected in series as shown in FIG. 2. During the testing time period, a gate electric potential of the P-channel transistor 221 is pulled up to a power supply voltage Vdd and a gate electric potential of the N-channel transistor 222 is pulled down to the ground electric potential. On the other hand, during the time period other than the testing time period, the gates of the P-channel transistor 221 and the N-channel transistor 222 are adequately biased and the output signal Sout is output in a low impedance state. With this, an output impedance of the amplifying section 20 is in a high impedance state during the testing time period, and the amplifying section 20 outputs the output signal Sout to the first external terminal TA, and thereby the output signal Sout is supplied to the external load 2 such as a headphone or the like through the internal load 71 during the time period other than the testing time period.

The semiconductor integrated circuit 10 further includes a test signal generating section 30, a resistor 40, an AD converting section 50 and a controlling section 60. The test signal generating section 30 has a signal generator 31 that generates the test signal TS in a differential style and an amplifier 32.

Any kind of test signal generated by the signal generator 30 can be used if the impedance of the external load 2 can be measured by using the test signal. However, it is preferable to use the test signal which can not be recognized by human ears. Meantime, the second control signal CTL2 is supplied to the signal generator 31, and the signal generator 31 generates the test signal TS in the testing time period where the second control signal CTL2 is in the high level.

Figure 3:
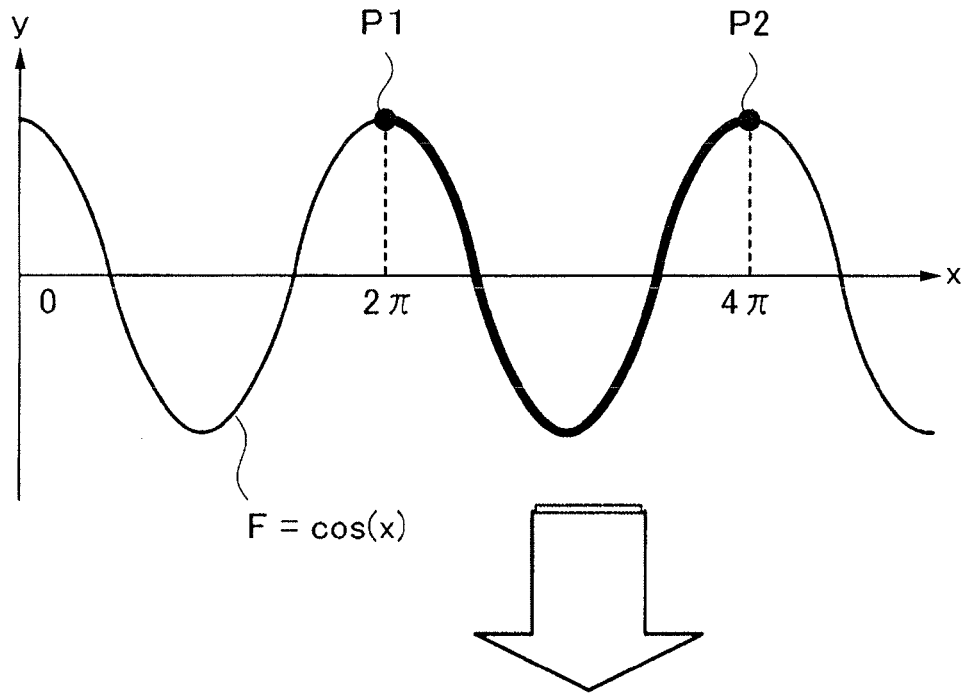
FIG. 3 is a schematic view explanatorily showing a waveform of a test signal.
Figure 3:
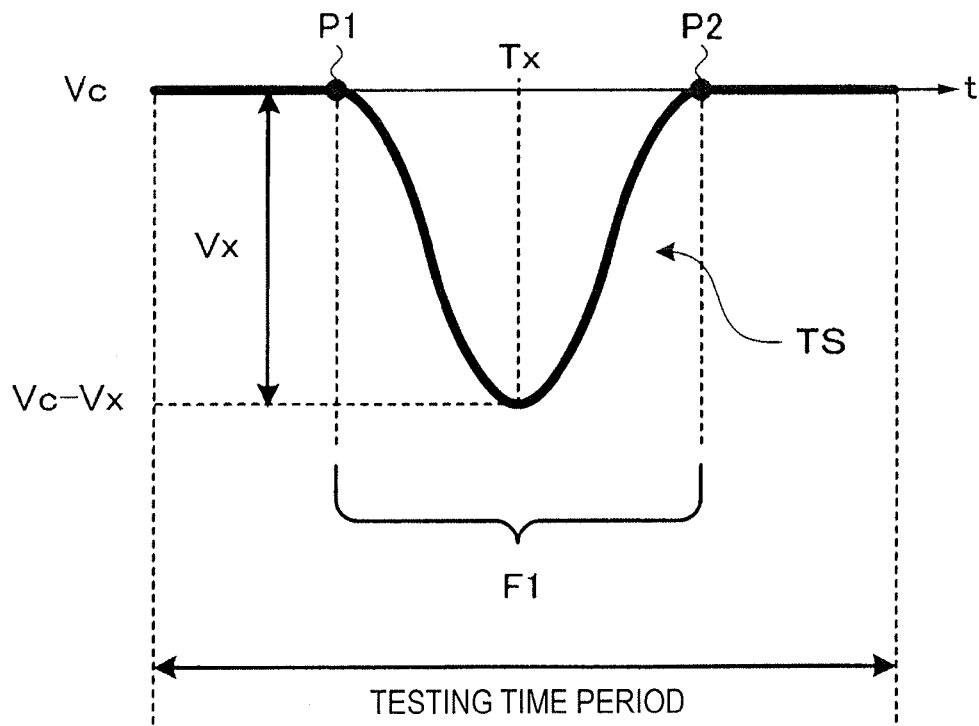

Here, as one example, the test signal is described below with reference to FIG. 3. The test signal TS includes a part which is obtained by cutting out a waveform F1 having one wavelength from a continuous cosine wave F. To be more specific, the test signal TS is configured such that a waveform F1 having one wavelength formed of a part from an upper side peak P1 (hereinafter, referred to as a first upper side peak P1) to the subsequent upper side peak P2 (hereinafter, referred to as a second upper side peak P2) is cut out from the cosine wave F, and levels of the first upper side peak P1 and the second upper side peak P2 are shifted so as to be on an amplitude center potential Vc of the output signal Sout. Incidentally, while the test signal TS generated by the signal generator 31 is in the differential type in the above embodiment, it can be in the single end type, as a matter of course. In this case, the signal generator 31 and the amplifier 32 are formed in single end types. In addition, the amplitude center potential Vc is, for example, a ground electric potential GND supplied to the second external terminal TB as a predetermined electric potential.

The reason why the test signal TS is generated as described in the above is that a user does not sense an abnormal sound. In order to allow a user not to be aware of a sound even when the test signal is reproduced by a headphone or a speaker, it is necessary that: 1) a frequency component of the test signal TS is reduced so as to cause the sound not to be sensed by human ears in an audible band; and 2) a time period of generation of the test signal TS is reduced so as to cause it not to be recognized by human ears.

When, for example, the waveform of the test signal TS is made to be a continuous cosine wave, the frequency component has large energy in a basic frequency f so that the test signal TS is readily sensed by human ears. In order to reduce the energy of the basic frequency f, it is enough to reduce the amplitude of the test signal TS. However, when the amplitude of the test signal TS is reduced so as to cause the test signal TS not to be sensed by human ears, an SN ratio is lowered in a case where an impedance of the external load 2 is measured so that the measured impedance becomes inaccurate.

Figure 5:
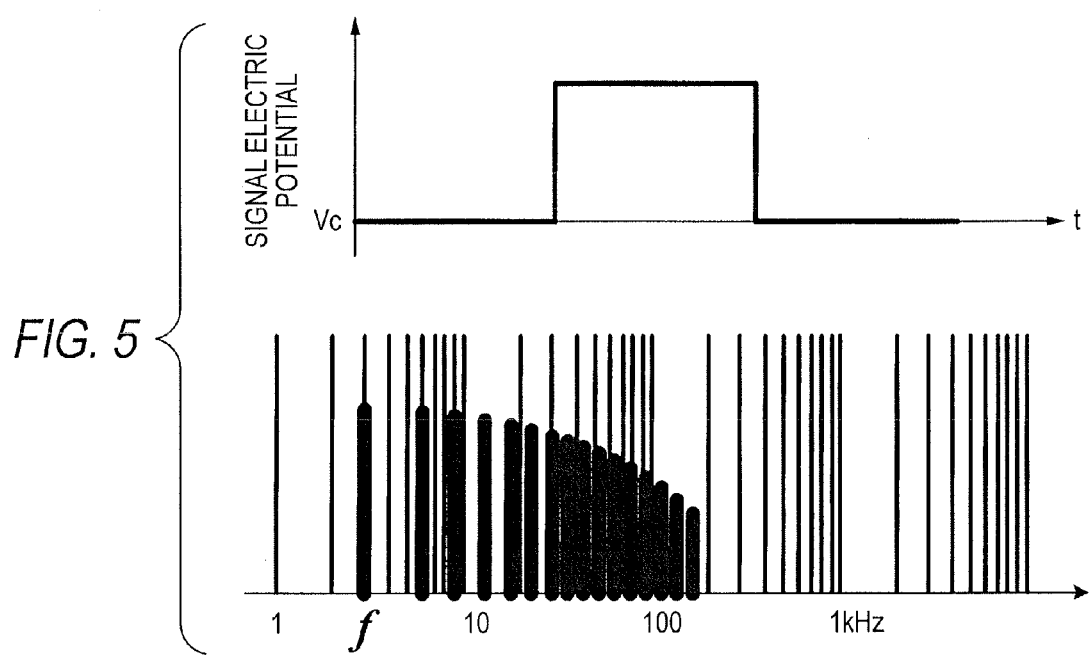
FIG. 5 is a schematic view explanatorily showing a comparison example of a test signal.

In addition, when, for example, a waveform of the test signal TS is made to be a square wave as shown in FIG. 5, the frequency component of the test signal TS has large energy in a basic frequency f and harmonic frequencies so that the test signal TS is readily sensed by human ears.

Figure 6:
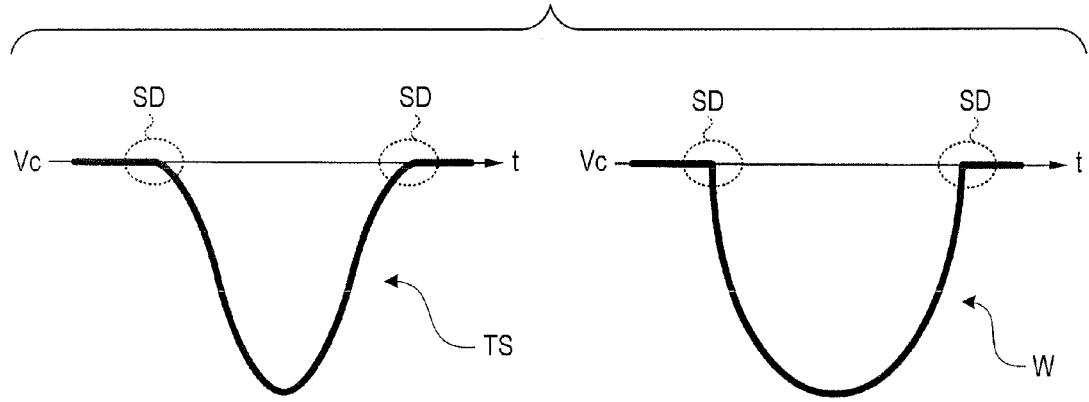
FIG. 6 is a schematic view explanatorily showing a comparison example of a test signal.

Consequently, in the embodiment, the test signal TS is made to have one wavelength F1 cut out from a cosine wave so that a generation time period of the test signal TS is reduced, and thereby its higher harmonic components are hardly generated. For example, when a waveform W obtained by cutting out a part having a half wavelength from a cosine wave and the test signal TS are compared to each other as shown in FIG. 6, it is understood that the waveform W has steep curves at shoulder portions SD as compared to the test signal TS. Therefore, while the waveform W obtained by cutting out the part having the half wavelength from the cosine wave causes its higher harmonic components to be generated, the test signal TS has moderate curves so that higher harmonic components are hardly generated.

Figure 4:
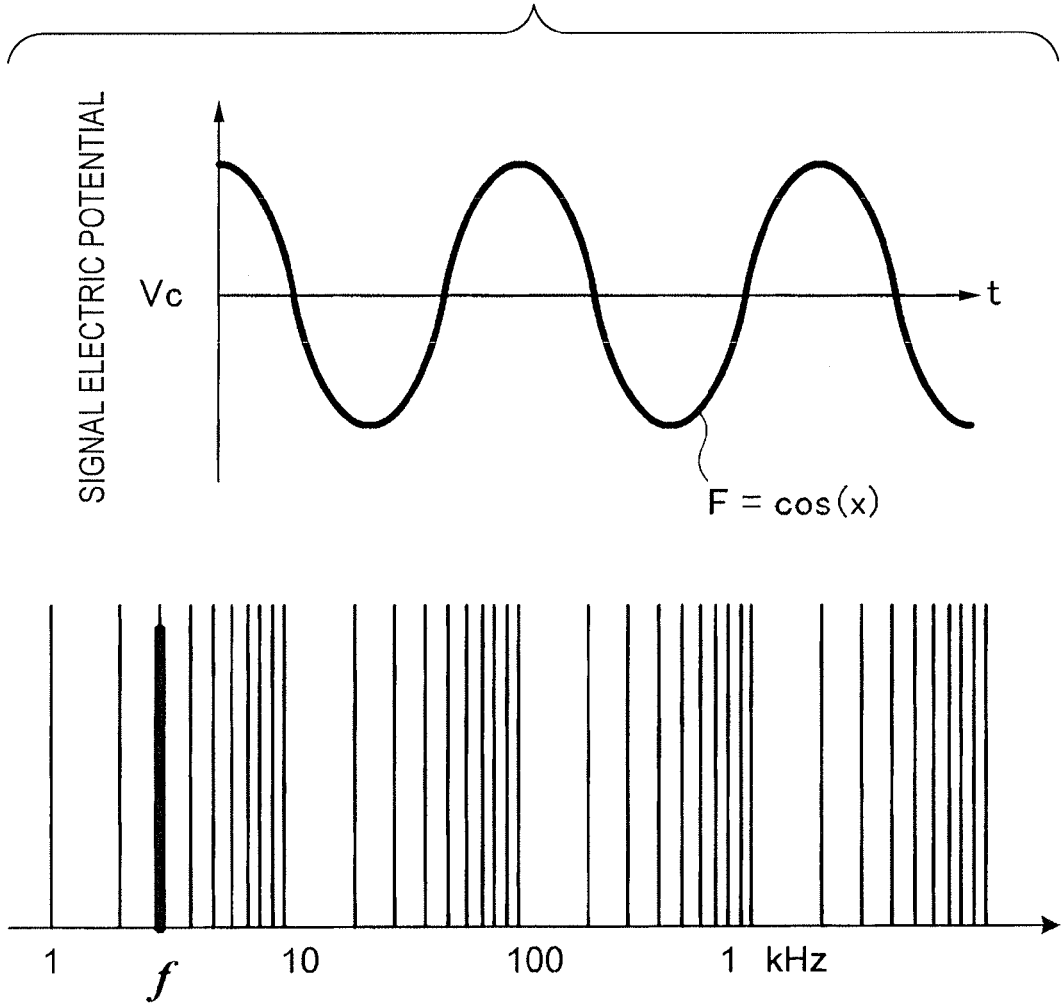
FIG. 4 is a schematic view explanatorily showing a comparison example of a test signal.
Figure 7:
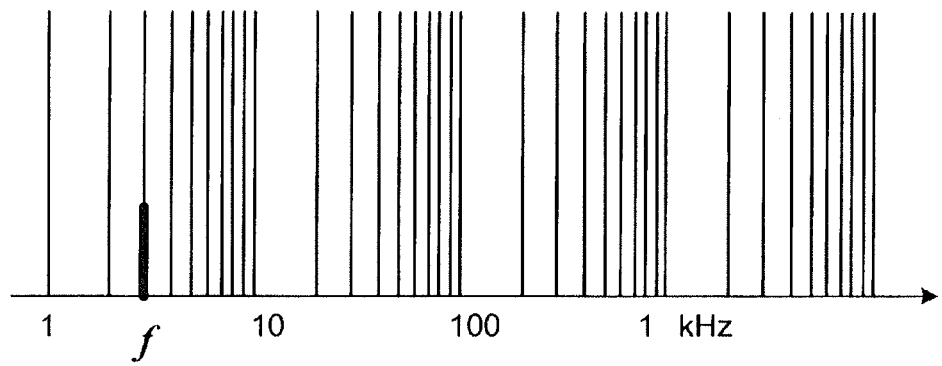
FIG. 7 is a schematic view explanatorily showing a spectrum of the test signal.

As a result, a spectrum of the test signal TS becomes one shown in FIG. 7, and thereby the energy of the basic frequency f can be markedly reduced as compared to the case where the cosine wave is continued as shown in FIG. 4. In addition, since the generation time period is short, the amplitude Vx (see FIG. 3) of the test signal TS can be set to be large, and thereby the impedance of the external load 2 can be measured at a high SN ratio.

In the embodiment, the basic frequency f of the test signal TS is 3 Hz. Since the audible band is defined as 20 Hz to 20 KHz, the basic frequency f of the test signal TS is lower than the lowest frequency of the audible band. In general, the higher the frequency of the test signal TS is, the more the level of the test signal TS is attenuated by being affected by a stray capacitance, a stray inductance or a circuit resistance. Therefore, a measurement error of the impedance of the external load 2 becomes large. On the other hand, in a frequency lower than the lowest frequency of the audible band, the test signal TS is seldom attenuated by being affected by a stray capacitance, a stray inductance or a circuit resistance. In addition, since the higher harmonic component is markedly small, a higher harmonic wave which is heard as an abnormal sound by a human in the audible band, is not generated. Accordingly, it is possible to accurately measure the impedance of the external load 2 by using the test signal TS which does not bother a user.

Explanation is returned to FIG. 1. The amplifier 32 amplifies the test signal TS in a predetermined gain and supplies the amplified signal to the resistor 40. In addition, an output stage of the amplifier 32 is, for example, configured as shown in FIG. 2, similarly to the amplifier 22. The output stage of the amplifier 32 is configured such that the gates of the P-channel transistor 221 and the N-channel transistor 222 are adequately biased during the testing time period in which the second control signal CTL2 is in a high level, and the amplifier 32 is in an off-state during the time period other than the testing time period in which the second control signal CTL2 is in a low level. With this, the test signal generating section 30 supplies the test signal TS to the external load 2 such as a headphone through the resistor 40 during the testing time period, and the second terminal T2 becomes in a high impedance state in association with transition of the output side of the test signal generating section 30 to the high impedance state during the time period other than the testing time period.

Next, the AD converting section 50 outputs detection data D obtained by AD-converting an electric potential of the second terminal T2, to the controlling section 60. That is, the AD converting section 50 functions as a detecting section that detects the amplitude of the test signal TS at the second terminal T2 during the testing time period.

Next, a detection signal CTL which becomes active when the external load 2 such as a headphone or the like is connected to the first external terminal TA and the second external terminal TB from an outer device, is supplied to the controlling section 60. The controlling section 60 sets the second control signal CTL2 to be at a high level during a predetermined time period after the detection signal CTL becomes active. The time period in which the second control signal CTL2 is at the high level, is the testing time period. The controlling section 60 measures the impedance of the external load 2 on the basis of the detection data D in the testing time period and generates the first control signal CTL1 in accordance with the impedance of the external load 2. To be more specific, it is enough that the impedance is calculated on the basis of the detection data D at a clock time Tx at which the amplitude of the test signal TS becomes the maximum as shown in FIG. 3 (a signal level becomes the minimum).

The amplitude of the test signal TS generated by the signal generator 31 is already known as well as the gain of the amplifier 32 is already known. Accordingly, the amplitude of the test signal TS output from the test signal generating section 30 is also already known. Here, the impedance Zx of the external load 2 is given by the following formula (I) with the proviso that V2 represents the amplitude of the test signal TS output from the test signal generating section 30, V1 represents the amplitude of the test signal TS at the second terminal, Zy represents the impedance of the resistor 40 and Zx represents the impedance of the external load 2.

$$Zx=ZyV1/(V2-V1) \tag{1}$$

The control section 60 calculates the impedance Zx in accordance with the formula (I) so as to generate the first control signal CTL1 according to the impedance Zx, and thereby adjusts the gain of the amplifying section 20. As a result, even when any of various kinds of external loads 2 is connected, the amplifying section 20 can output a sound having an adequate sound level.

Figure 8:
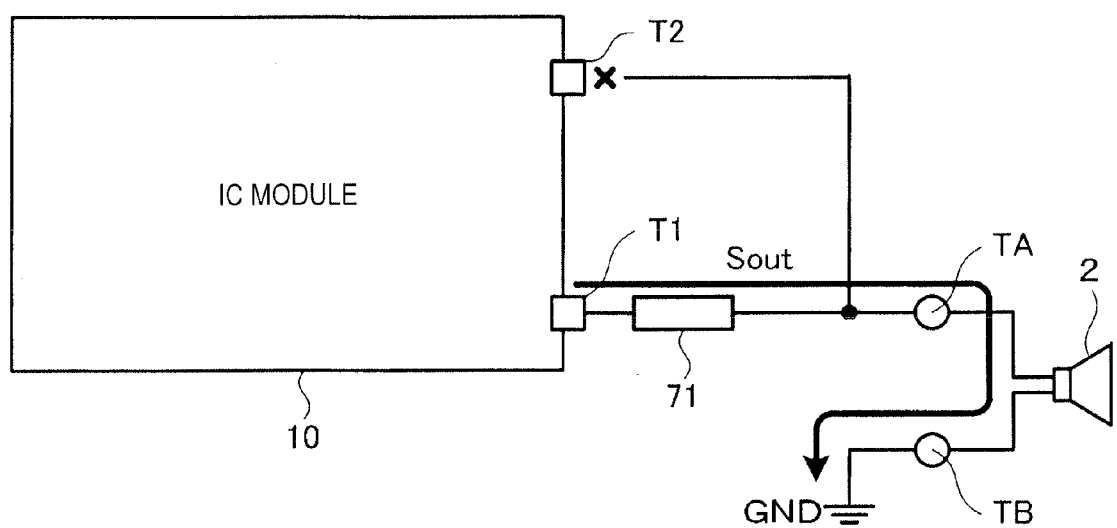
FIG. 8 is a schematic view explanatorily showing a route through which an output signal is supplied during a time period other than a testing time period.

In accordance with the embodiment, the output signal Sout output from the first terminal T1 is supplied to the external load 2 through the inner resistor 71 and the second terminal T2 becomes in a high impedance state during the time period other than the testing time period as shown in FIG. 8. Therefore, it is possible to supply the output signal Sout to the external load 2 independently to the test signal TS. In addition, since the output signal Sout is supplied through the internal load 71, the semiconductor integrated circuit 10 can be protected even when the external load 2 is short-circuited because of a damage thereof, and the external load 2 can be also protected even when an output signal Sout having a large amplitude is output from the semiconductor integrated circuit 10.

Figure 9:
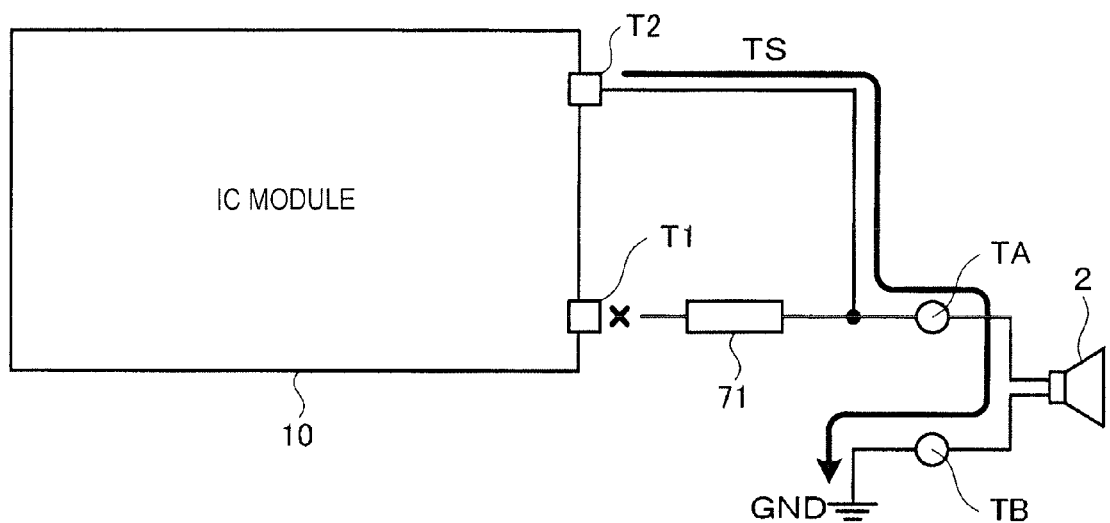
FIG. 9 is a schematic view explanatorily showing a route through which a test signal is supplied during a testing time period.

During the testing time period, the first terminal T1 becomes in the high impedance state as shown in FIG. 9, and the test signal TS output from the second terminal T2 is directly supplied to the external load 2 without passing through the internal load 71. As a result, the impedance of the external load 2 can be accurately specified without being affected by the internal load 71, and it is possible to output a sound having an adequate sound level even when any of various kinds of external loads 2 is connected.

Figure 11:
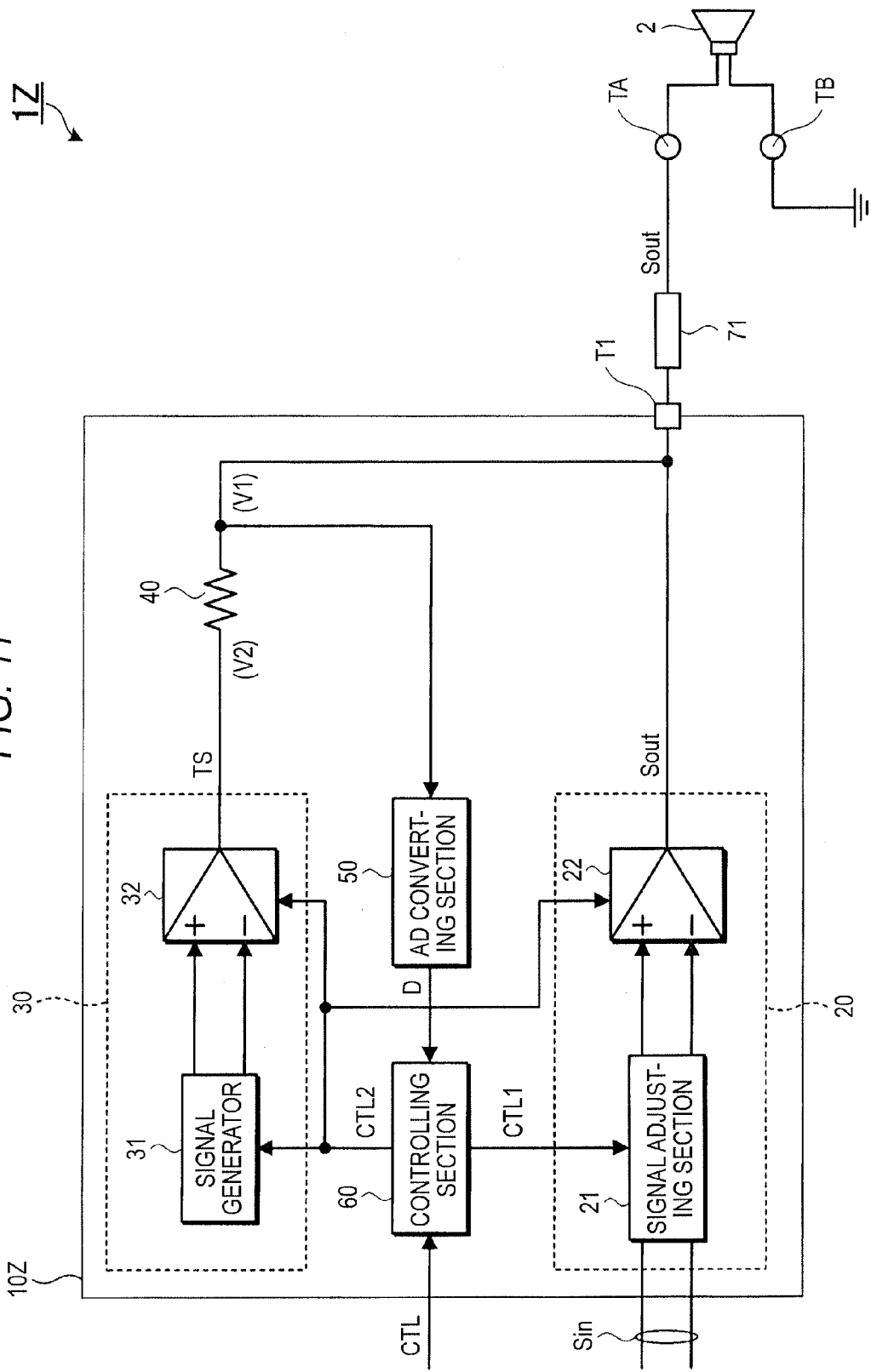
FIG. 11 is a block diagram showing a structure of a signal amplifying device according to a modified embodiment.

On the other hand, in a signal amplifying device 1Z shown in FIG. 11, a semiconductor integrated circuit 10Z does not includes the second terminal T2, and the resistor 40 is connected to the first terminal T1. Accordingly, the test signal TS is supplied to the external load 2 through the internal load 71. In this case, it is not possible to accurately specify the impedance of the external load 2 by being affected by the internal load 71.

In the embodiment, since the semiconductor integrated circuit 10 includes the second terminal T2, as well as the second terminal T2 and the first external terminal TA are connected to each other as shown in FIG. 1, the test signal TS can be supplied to the external load 2 by bypassing the internal load 71. As a result, it is possible to accurately specify the impedance of the external load 2 without being affected by the internal load 71, so that it is possible to output a sound having an adequate sound level even when any of various kinds of external loads 2 is connected.

2. Modified Embodiment

The invention is not limited to the aforementioned embodiment, and various kinds of modified embodiments, for example, described below can be made. In addition, of course, the aforementioned embodiment and each of the modified embodiments can be combined, if necessary.

Figure 10:
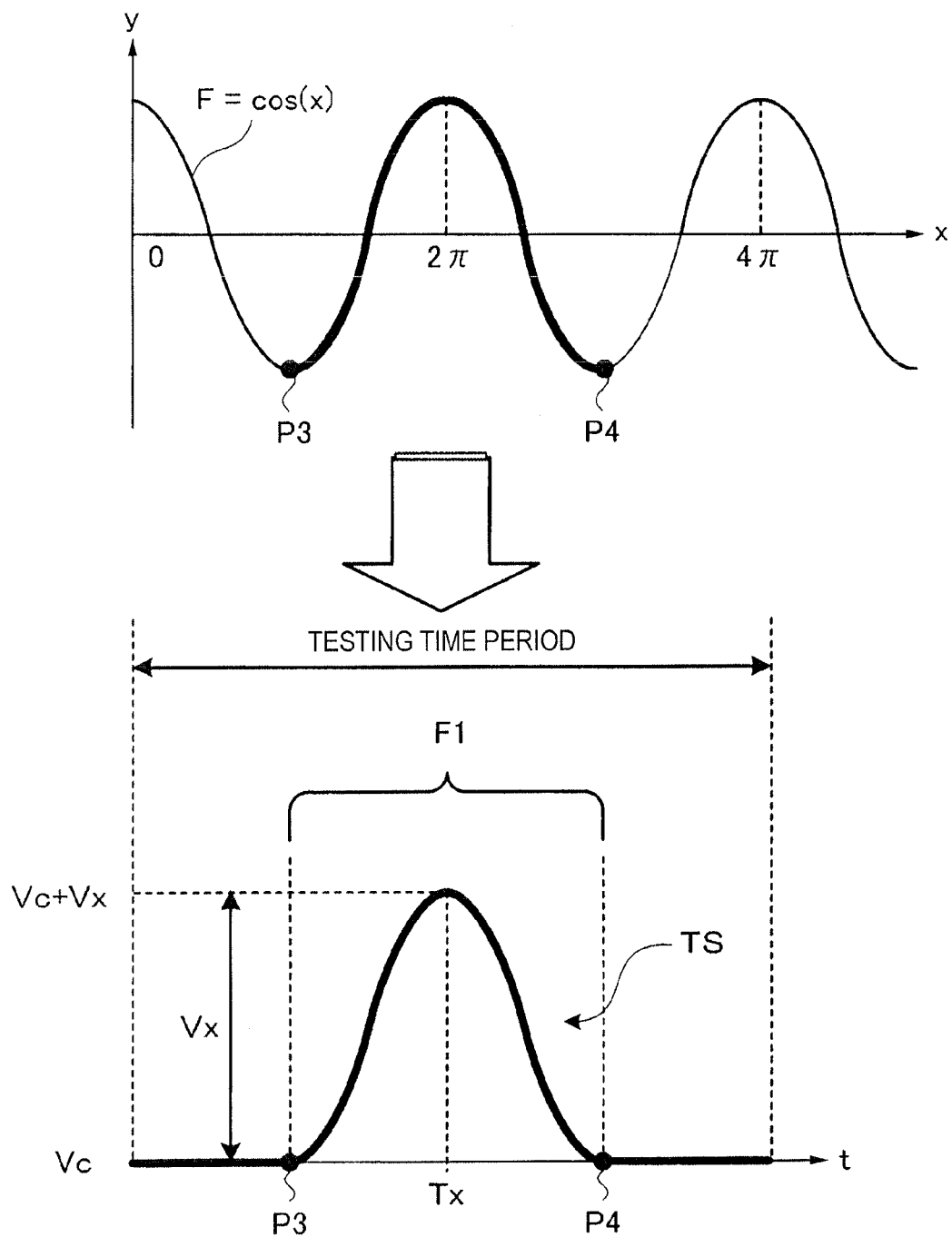
FIG. 10 is a schematic view explanatorily showing a waveform of a test signal according to a modified embodiment.

(1) While the test signal TS having a peak at a negative side with reference to the amplitude center electric potential Vc is described as one example in the embodiment, the invention is not limited to the above. The test signal TS can be obtained by cutting at any timing as long as the test signal TS has a waveform obtained by cutting out a part having one wavelength from a cosine wave. For example, it is possible that the test signal TS is configured such that, as shown in FIG. 10, a waveform F1 having one wavelength formed of a part from a lower side peak P3 (hereinafter, referred to as a first lower side peak P3) to the subsequent lower side peak P4 (hereinafter, referred to as a second lower side peak P4) is cut out from the cosine wave F, and levels of the first lower side peak P3 and the second lower side peak P4 are shifted so as to be on the amplitude center potential Vc of the output signal Sout. While the basic frequency f of the test signal TS is set to be smaller than 20 Hz as the lowest frequency of the audible band in the aforementioned embodiment, the invention is not limited thereto, and therefore the frequency of the test signal TS can be set to any value as long as a user is not aware of the test signal TS. However, it is preferable that the frequency is lower than 20 KHz as the highest frequency of the audible band in consideration of attenuation of the test signal TS. In addition, the audible band is in the range of 20 Hz to 20 KHz in the aforementioned embodiment, the audible band is changed for the intended purpose of the signal amplifying device 1. For example, an audible band having a range of 300 Hz to 3.5 KHz or a range of 100 Hz to 7 KHz is used in a telephone system.

(2) In the aforementioned embodiment, the semiconductor integrated circuit 10 includes the second terminal T2, the second terminal T2 is connected to the first external terminal TA, and the test signal TS is supplied to the external load 2 by bypassing the internal load 71. However, the invention is not limited to the above embodiment. The semiconductor integrated circuit 10 can have any structure as long as it is configured such that the test signal TS is supplied to the external load 2 during a testing time period and the output signal Sout is supplied to the external load 2 during a time period other than the testing time period.

For example, the semiconductor integrated circuit 10 can be one which is configured such that the second terminal T2 is not provided at a semiconductor integrated circuit 10Z and the resistor 40 is connected to the first terminal T1, as in a signal amplifying device 1Z shown in FIG. 11. In this case, the test signal TS is supplied to the external load 2 through the internal load 71. When the magnitude of the internal load 71 is small, the impedance of the external load 2 can be measured with necessary precision also in the modified embodiment. In addition, when the magnitude of the internal load 71 is already known, the impedance of the external load 2 can be measured in consideration of that.

Also, in this case, since the waveform obtained by cutting out a part having one wavelength F1 from a cosine wave is used as the test signal TS, it is possible to allow a user not to be aware of a sound even when the test signal TS is supplied to a headphone, a speaker or the like.

(3) While the amplitude V2 of the test signal TS output from the test signal generating section 30 is already known in the aforementioned embodiment, the invention is not limited thereto. It is possible that the amplitude V2 of the test signal TS output from the test signal generating section 30 is measured, and thereby the impedance of the external load 2 is specified.

Figure 12:
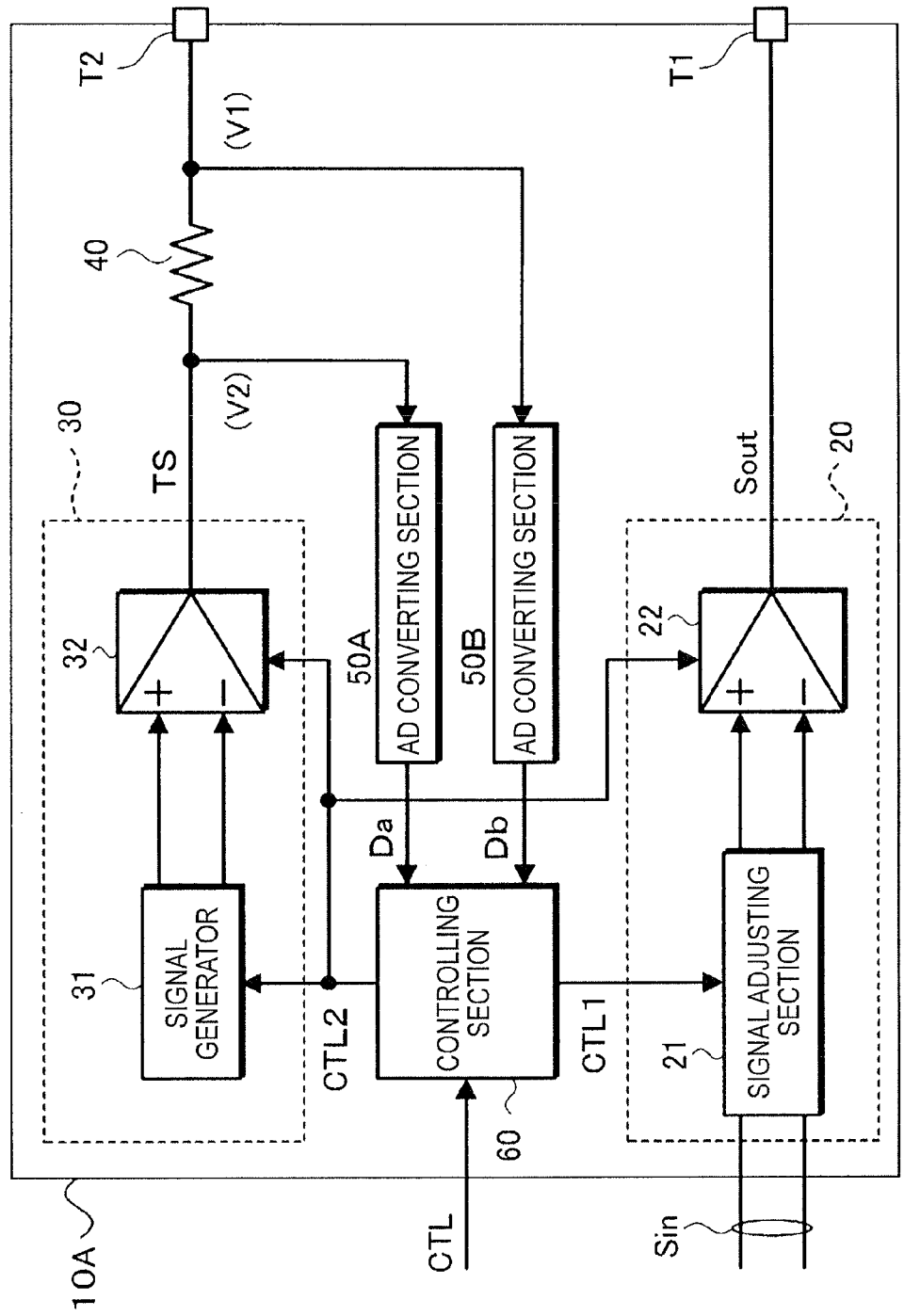
FIG. 12 is a block diagram showing a structure of a semiconductor integrated circuit according to a first modified embodiment.

For example, the signal amplifying device 1 can be constituted by using a semiconductor integrated circuit 10A shown in FIG. 12. In this case, it is possible that the semiconductor integrated circuit 10A includes an AD converting section 50A which AD-converts the amplitude V2 of the test signal TS output from the test signal generating section 30 so as to output detection data Da and an AD converting section 50B which AD-converts the amplitude V1 of the test signal TS at the second terminal T2 so as to output detection data Db, and the control section 60 specifies the impedance of the external load 2 on the basis of the detection data Da and the detection data Db.

Figure 13:
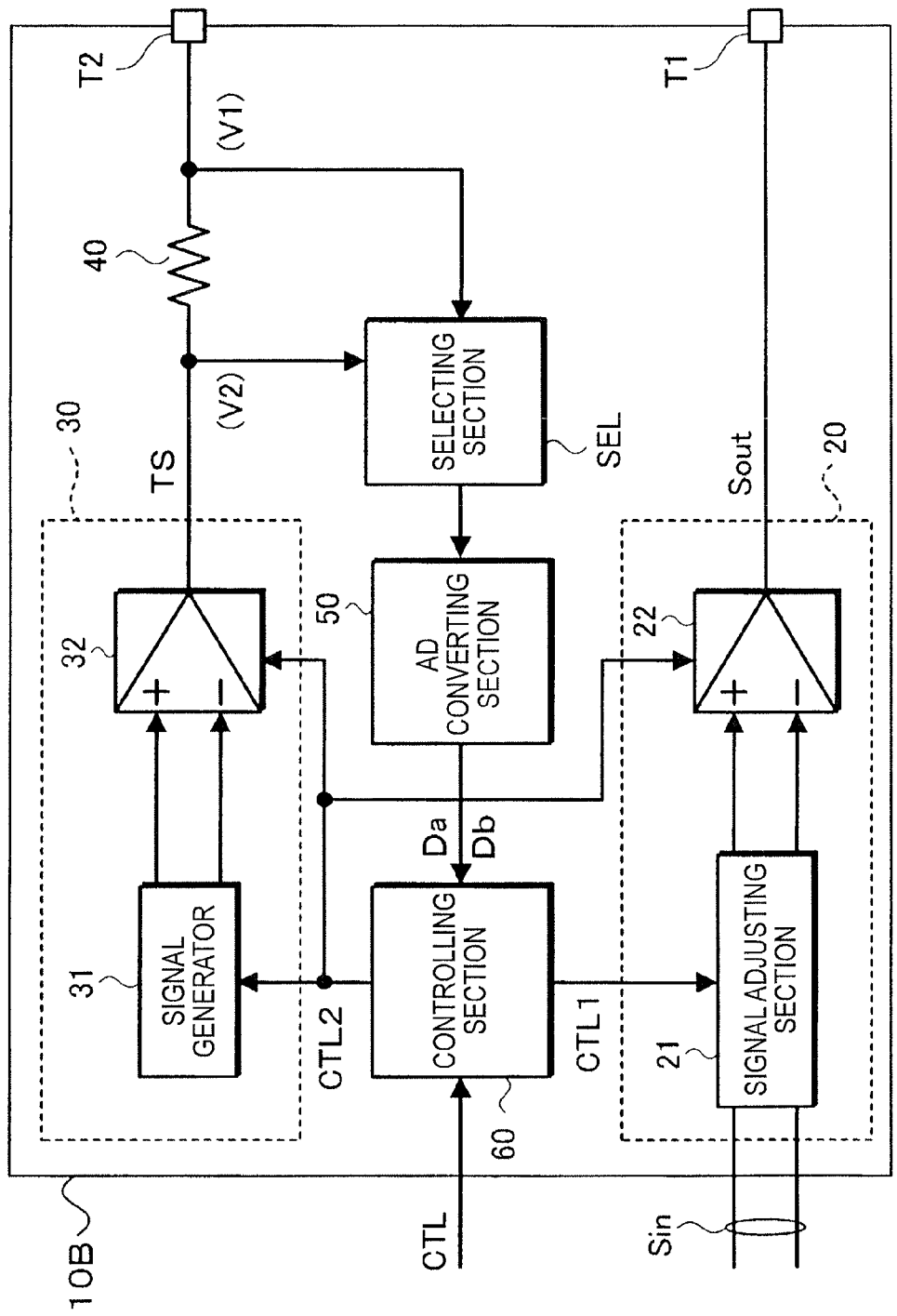
FIG. 13 is a block diagram showing a structure of a semiconductor integrated circuit according to a second modified embodiment.

Alternatively, it is possible to form the signal amplifying device 1 by using a semiconductor integrated circuit 10B shown in FIG. 13. In this case, it is possible that the semiconductor integrated circuit 10B includes a selecting section SEL that selects one of the amplitude V2 of the test signal output from the test signal generating section 30 and the amplitude V1 of the test signal TS at the second terminal T2, and the control section 60 specifies the impedance of the external load 2 on the basis of the detection data Da and the detection data Db which are supplied thereto in a time sharing fashion.

Thus, when the amplitude V2 of the test signal TS is measured as in the above description, the amplitude V2 is actually measured even if the amplitude V2 of the test signal TS varies due to variation in manufacturing, a temperature characteristic, or a change with the lapse of time of the test signal generating section 30. Therefore, it is possible to more accurately measure the impedance of the external load 2.

(4) In the aforementioned embodiment and the modified embodiment, the controlling section 60 calculates the impedance of the external load 2 in accordance with the formula (I). However, the invention is not limited to the above embodiments, and the first control signal CTL1 can be generated on the basis of the amplitude V1 of the test signal TS at the second terminal T2. Since the amplitude V2 of the test signal TS output from the test signal generating section 30 is fixed, the impedance of the external load 2 and the amplitude V1 of the test signal TS at the second terminal T2 are in one-to-one correspondence. Since the gain of the amplifying section 20 is determined in accordance with the impedance of the external load 2, the first control signal CTL1 can be directly generated without calculating the impedance under a condition that a relationship between the amplitude V1 of the test signal TS and the gain of the amplifying section 20 is determined in advance. To be specific, it is enough that magnitudes of the amplitude V1 of the test signal TS and the first control signal CTL1 are stored in a table in a memory, and the first control signal CTL1 is generated by referencing the table.

(5) While the two-pole type plug is described in the aforementioned embodiment, the invention can be applied to a three-pole or four-pole type plug, as a matter of course. As a four-pole type plug, there are a first model in which terminals of Lch, Rch, GND and MIC are arranged from its tip portion and a second model in which terminals of Lch, Rch, MIC and GND are arranged from its tip portion. In this case, the terminal of GND is connected to an electrode at the third position from the tip portion in the first model, but the terminal of MIC is connected to the electrode in the second mode. In a case where the above embodiment is applied to the four-pole type plug, the first model and the second model can be discriminated from one another by calculating an impedance of the electrode at the third position from the tip portion. In the first model, the terminal of GND is connected so that the impedance becomes zero. In the second model, the terminal of MIC is connected so that an impedance of a microphone can be calculated. Therefore, it is possible to determine a kind of the plug on the basis of the impedance.

Here, the above embodiments are summarized as follows.

A semiconductor integrated circuit is able to be used in a signal amplifying device (a test signal supplying device) provided with a first external terminal, a second external terminal to be applied with a predetermined electric potential and an internal load whose one end is connected to the first external terminal. The semiconductor integrated circuit includes a first terminal to be connected to the other end of the internal load, a second terminal to be connected to the first external terminal, an amplifying section that amplifies an input signal and outputs an output signal to the first terminal, a resistor whose one end is connected to the second terminal, a test signal generating section that generates a test signal and supplies the test signal to the other end of the resistor, a detecting section that detects an amplitude of the test signal at the second terminal, and a controlling section that controls a gain of the amplifying section on the basis of a detection result of the detecting section.

In accordance with the invention, the first terminal for outputting an output signal and the second terminal for outputting a test signal are independently provided in the semiconductor integrated circuit, and the second terminal is connected to the first external terminal. Therefore, the output signal is supplied to the external load in a route from the first terminal to the external load through the internal load and the first external terminal, and the test signal is supplied to the external load in a route from the second terminal to the external load through the first external terminal. As a result, since the test signal is not supplied to the internal load, it is possible to adjust the gain of the amplifying section in accordance with the accurate impedance of the external load.

In the semiconductor integrated circuit, for example, during a testing time period, the controlling section controls the test signal generating section so as to output the test signal, and controls the amplifying section so as to cause an output impedance to be in a high impedance state. It is also preferable that, during a time period other than the testing time period, the controlling section controls the test signal generating section so as to cause an output impedance to be in a high impedance state, and controls the amplifying section so as to output the test signal. In accordance with this embodiment, since the first terminal from which an output signal is output and the second terminal from which a test signal is output, become exclusively in the high impedance states, the output signal and the test signal can be exclusively output from the first output terminal to the external load.

In addition, in the semiconductor integrated circuit, for example, the predetermined electric potential is a ground electric potential, and the detecting section detects an amplitude of the test signal at the second terminal and an amplitude of the test signal at the other end of the resistor. In accordance with this invention, since the amplitude of the test signal at the other end of the resistor is detected, it is possible to accurately specify the impedance of the external load even when the amplitude of the test signal output from the test signal generating section is unknown or the amplitude of the test signal output therefrom varies due to a temperature characteristic or a change with the lapse of time of the test signal generating section.

Further, for example, the signal amplifying device according to the invention includes the above-described semiconductor integrated circuit, a first external terminal connected to the second terminal, a second external terminal to be supplied with a predetermined electric potential, and an internal load of which the one end is connected to the first external terminal and the other end is connected to the first terminal.

Also, a semiconductor integrated circuit is to be used in a signal amplifying device (a test signal supplying device) which is provided with an external terminal to which an external load is to be connected and an internal load having one end connected to the external terminal. The semiconductor integrated circuit includes: an amplifying section that amplifies an input signal and outputs an output signal to the other end of the internal load; a resistor of which the one end is connected to the external terminal or the other end of the internal load; a test signal generating section that generates, as a test signal, a waveform having one wavelength of a cosine wave and supplies the test signal to the other end of the resistor; a detecting section that detects an amplitude of the test signal at the one end of the resistor; and a controlling section that controls a gain of the amplifying section on the basis of a detection result of the detecting section.

By the above configuration, since a waveform having one wavelength of a cosine wave is used as the test signal, measuring of an impedance of an external load can be completed in a short time period. Therefore, it is possible to make the test signal not to be sensed by a user as an abnormal noise.

For example, the waveform having one wavelength of a cosine wave is formed of a part from an upper side peak to the subsequent upper side peak of the cosine wave. In this case, since a shoulder portion of the test signal can be made in a moderate curve, it is possible to prevent a higher harmonic component from being generated.

For example, the input signal is a sound signal and a frequency of the test signal is lower than the highest frequency of an audible band. In a case where the frequency of the test signal is within an audible band, an impedance can be measured by a frequency which allows an external load to operate as a headphone or a speaker so that it is possible to accurately measure the impedance of the external load. Further, in a case where the frequency of the test signal is lower than the lowest frequency of an audible band, the test signal is hardly attenuated by a stray capacitance, a stray inductance, a circuit resistance or the like so that it is possible to accurately measure the impedance of the external load.

Moreover, the signal amplifying device includes a first external terminal as the external terminal, a second external terminal to which a predetermined electric potential is to be supplied, an internal load of which the one end is connected to the first external terminal, and the aforementioned semiconductor integrated circuit. The semiconductor integrated circuit is provided with a first terminal to be connected to the other end of the internal load, and a second terminal which is to be connected to the first external terminal and is to be connected to one end of the resistor.

By the above configuration, the first terminal for outputting an output signal and the second terminal for outputting a test signal are independently provided in the semiconductor integrated circuit, and the second terminal is connected to the first external terminal. Therefore, the output signal is supplied to the external load in a route from the first terminal to the external load through the internal load and the first external terminal, and the test signal is supplied to the external load in a route from the second terminal to the external load through the first external terminal. As a result, since the test signal is not supplied to the internal load, it is possible to adjust the gain of the amplifying section in accordance with the accurate impedance of the external load.

Although the invention has been illustrated and described for the particular preferred embodiments, it is apparent to a person skilled in the art that various changes and modifications can be made on the basis of the teachings of the invention. It is apparent that such changes and modifications are within the spirit, scope, and intention of the invention as defined by the appended claims.

The present application is based on Japanese Patent Application No. 2012-113383 filed on May 17, 2012 and Japanese Patent Application No. 2012-113384 filed on May 17, 2012, the contents of which are incorporated herein by reference.

What is claimed is:
1. A test signal supplying device, comprising:
a first external terminal;
a second external terminal being applied with a predetermined electric potential;
an internal load;
a first terminal that is connected to the first external terminal through the internal load;
a second terminal that is connected to the first external terminal without passing through the internal load;
a test signal generating section that generates a test signal and supplies the test signal to the second terminal;
a detecting section that detects an amplitude of the test signal;
a controlling section that measures an impedance of a sound emitter connected to the first and second external terminals based on the detected amplitude of the test signal; and
an amplifying section that amplifies a sound signal and outputs the amplified sound signal to the first terminal,
wherein the controlling section controls a gain of the amplifying section based on the measured impedance of the sound emitter; and
wherein the internal load protects the sound emitter.

2. The test signal supplying device according to claim 1, further comprising:
a resistor having one end being connected to the test signal generating section and the other end being connected to the second terminal,
wherein the detecting section detects the amplitude of the test signal at least one of the one end and the other end of the resistor.

3. The test signal supplying device according to claim 1, wherein the controlling section controls the amplifying section so that an output impedance of the amplifying section is in a high impedance state during a testing time period where the test signal generating section outputs the test signal; and
wherein the controlling section controls the test signal generating section so that an output impedance of the test signal generating section is in a high impedance state and controls the amplifying section so as to output the amplified sound signal to the first terminal during a time period other than the testing time period.

4. The test signal supplying device according to claim 1, wherein the predetermined electric potential is a ground electric potential.

5. The test signal supplying device according to claim 1, wherein the test signal has a waveform containing one wavelength of a cosine wave.

6. The test signal supplying device according to claim 5, wherein the waveform of the test signal is formed of a part from an upper side peak to a subsequent upper side peak in the cosine wave.

7. The test signal supplying device according to claim 1, wherein the test signal has a frequency being lower than the highest frequency of an audible band.

8. A semiconductor integrated circuit, comprising:
a first terminal to be connected to a first external terminal through an internal load;
a second terminal to be connected to the first external terminal without passing through the internal load;
a test signal generating section that generates a test signal and supplies the test signal to the second terminal;
a detecting section that detects an amplitude of the test signal;
a controlling section that measures an impedance of a sound emitter connected to the first and second external terminals based on the detected amplitude of the test signal; and
an amplifying section that amplifies a sound signal and outputs the amplified sound signal to the first terminal,
wherein the controlling section controls a gain of the amplifying section based on the measured impedance of the sound emitter; and
wherein the internal load protects the sound emitter.

9. The semiconductor integrated circuit according to claim 8, further comprising:
a resistor having one end being connected to the test signal generating section and the other end being connected to the second terminal, wherein the detecting section detects the amplitude of the test signal at least one of the one end and the other end of the resistor.

10. The test signal supplying device according to claim 8, wherein the controlling section controls the amplifying section so that an output impedance of the amplifying section is in a high impedance state during a testing time period where the test signal generating section outputs the test signal; and wherein the controlling section controls the test signal generating section so that an output impedance of the test signal generating section is in a high impedance state and controls the amplifying section so as to output the output signal to the first terminal during a time period other than the testing time period.

11. A test signal supplying device, comprising:
an external terminal;
an internal load connected to the external terminal;
a test signal generating section that generates a test signal having a waveform containing one wavelength of a cosine wave and supplies the test signal to the external terminal;
a detecting section that detects an amplitude of the test signal;
a controlling section that measures an impedance of a sound emitter connected to the external terminal based on the detected amplitude of the test signal; and
an amplifying section that amplifies a sound signal and outputs the amplified sound signal to the internal load,
wherein the controlling section controls a gain of the amplifying section based on the measured impedance of the sound emitter; and
wherein the internal load protects the sound emitter.

12. The test signal supplying device according to claim 11, wherein the waveform of the test signal is formed of a part from an upper side peak to a subsequent upper side peak in the cosine wave.

13. The test signal supplying device according to claim 11, wherein the test signal has a frequency being lower than the highest frequency of an audible band.

14. The test signal supplying device according to claim 11, further comprising:
a resistor having one end being connected to the test signal generating section and the other end being connected to the external terminal,
wherein the detecting section detects the amplitude of the test signal at least one of the one end and the other end of the resistor.

15. The test signal supplying device according to claim 11, wherein the controlling section controls the amplifying section so that an output impedance of the amplifying section is in a high impedance state during a testing time period where the test signal generating section outputs the test signal; and wherein the controlling section controls the test signal generating section so that an output impedance of the test signal generating section is in a high impedance state and controls the amplifying section so as to output the amplified sound signal to the first terminal during a time period other than the testing time period.

16. A semiconductor integrated circuit, comprising:
a first terminal to be connected to an external terminal through an internal load or without through the internal load;
a test signal generating section that generates a test signal having a waveform containing one wavelength of a cosine wave and supplies the test signal to the first terminal;
a detecting section that detects an amplitude of the test signal;
a controlling section that measures an impedance of a sound emitter connected to the external terminal based on the detected amplitude of the test signal; and
an amplifying section that amplifies a sound signal and outputs the amplified sound signal to the first terminal or a second terminal different from the first terminal,
wherein the controlling section controls a gain of the amplifying section based on the measured impedance of the sound emitter; and
wherein the internal load protects the sound emitter.

17. The semiconductor integrated circuit according to claim 16, wherein the waveform of the test signal is formed of a part from an upper side peak to a subsequent upper side peak in the cosine wave.

18. The semiconductor integrated circuit according to claim 16, wherein the test signal has a frequency being lower than the highest frequency of an audible band.

19. The semiconductor integrated circuit according to claim 16, further comprising:
a resistor having one end being connected to the test signal generating section and the other end being connected to the first terminal,
wherein the detecting section detects the amplitude of the test signal at least one of the one end and the other end of the resistor.

20. The semiconductor integrated circuit according to claim 16, wherein the controlling section controls the amplifying section so that an output impedance of the amplifying section is in a high impedance state during a testing time period where the test signal generating section outputs the test signal; and wherein the controlling section controls the test signal generating section so that an output impedance of the test signal generating section is in a high impedance state and controls the amplifying section so as to output the amplified sound signal to the first terminal during a time period other than the testing time period.

* * * * *